United States Patent
Li et al.

(10) Patent No.: US 7,545,889 B2
(45) Date of Patent: Jun. 9, 2009

(54) BLOCKER PERFORMANCE IN A RADIO RECEIVER

(75) Inventors: Qiang Tom Li, Irvine, CA (US); Hooman Darabi, Irvine, CA (US)

(73) Assignee: Broadcom Corporation, Irvine, CA (US)

(*) Notice: Subject to any disclaimer, the term of this patent is extended or adjusted under 35 U.S.C. 154(b) by 616 days.

(21) Appl. No.: 11/260,848

(22) Filed: Oct. 26, 2005

(65) Prior Publication Data

US 2007/0092038 A1    Apr. 26, 2007

(51) Int. Cl.
*H04L 27/22*    (2006.01)
*H04B 1/16*    (2006.01)

(52) U.S. Cl. .................. 375/332; 375/316; 455/339; 455/340

(58) Field of Classification Search .......... 375/279, 375/281, 316, 320, 321, 329, 332, 344, 345; 455/192.1, 192.2, 195.1, 206, 339, 205, 150.1, 455/154.1, 189.1, 191.1, 340; 329/304, 306, 329/323, 346
See application file for complete search history.

(56) References Cited

U.S. PATENT DOCUMENTS

| | | | | |
|---|---|---|---|---|
| 5,793,244 A | * | 8/1998 | Ueda | 327/351 |
| 6,631,170 B1 | * | 10/2003 | Gu | 375/316 |
| 2003/0104797 A1 | * | 6/2003 | Webster et al. | 455/296 |
| 2005/0186935 A1 | * | 8/2005 | Kawama et al. | 455/334 |
| 2005/0220217 A1 | * | 10/2005 | Yamawaki et al. | 375/297 |
| 2005/0253647 A1 | * | 11/2005 | Hagari | 327/554 |
| 2006/0044961 A1 | * | 3/2006 | Jin | 369/44.13 |

* cited by examiner

*Primary Examiner*—Young T. Tse
(74) *Attorney, Agent, or Firm*—Garlick Harrison & Markison; Bruce E. Garlick; Holly L. Rudnick

(57) ABSTRACT

Configuring a multiple stage band pass filter of a radio frequency receiver commences by setting a corner of a low pass mixer output filter that receives a down sampled analog information signal. Operation continues with setting a buffer output filter corner of a low pass buffer output filter coupled to an output of low pass mixer output filter via a buffer. Then, operation includes setting the poles and zero of a plurality of band pass filters coupled to the output of the low pass buffer output filter is performed. This operation includes first setting a zero of a respected band pass filter and then setting the plurality of poles of the band pass filter. Finally, operation concludes with setting a combined gain of the combination of the low pass mixer output filter, the low pass buffer output filter, and the plurality of band pass filters.

26 Claims, 9 Drawing Sheets

US 7,545,889 B2

BLOCKER PERFORMANCE IN A RADIO RECEIVER

BACKGROUND OF THE INVENTION

1. Technical Field of the Invention

This invention relates generally to wireless communication systems and more particularly to wireless receivers.

2. Description of Related Art

Communication systems are known to support wireless and wire lined communications between wireless and/or wire lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards including, but not limited to, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), and/or variations thereof.

Depending on the type of wireless communication system, a wireless communication device, such as a cellular telephone, two-way radio, personal digital assistant (PDA), personal computer (PC), laptop computer, home entertainment equipment, et cetera communicates directly or indirectly with other wireless communication devices. For direct communications (also known as point-to-point communications), the participating wireless communication devices tune their receivers and transmitters to the same channel or channels (e.g., one of the plurality of radio frequency (RF) carriers of the wireless communication system) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switch telephone network, via the Internet, and/or via some other wide area network.

For each wireless communication device to participate in wireless communications, it includes a built-in radio transceiver (i.e., receiver and transmitter) or is coupled to an associated radio transceiver (e.g., a station for in-home and/or in-building wireless communication networks, RF modem, etc.). As is known, the receiver is coupled to the antenna and includes a low noise amplifier, one or more intermediate frequency stages, a filtering stage, and a data recovery stage. The low noise amplifier receives inbound RF signals via the antenna and amplifies then. The one or more intermediate frequency stages mix the amplified RF signals with one or more local oscillations to convert the amplified RF signal into baseband signals or intermediate frequency (IF) signals. The filtering stage filters the baseband signals or the IF signals to attenuate unwanted out of band signals to produce filtered signals. The data recovery stage recovers raw data from the filtered signals in accordance with the particular wireless communication standard.

As is also known, the transmitter includes a data modulation stage, one or more intermediate frequency stages, and a power amplifier. The data modulation stage converts raw data into baseband signals in accordance with a particular wireless communication standard. The one or more intermediate frequency stages mix the baseband signals with one or more local oscillations to produce RF signals. The power amplifier amplifies the RF signals prior to transmission via an antenna.

RF transceivers must meet stringent operating standards with regard to the blocking of out of band and out of channel interference, i.e., adjacent channel signal and noise and out of band signal and noise. Implementing on-chip band pass filters to meet these stringent requirements is particularly difficult for narrow channels, such as the 20 kHz channels of a GSM/GPRS/EDGE communication system. Thus, a need exists for an on-chip band pass filter structure and operational methodology for meeting these requirements.

BRIEF SUMMARY OF THE INVENTION

The present invention is directed to apparatus and methods of operation that are further described in the following Brief Description of the Drawings, the Detailed Description of the Invention, and the claims. Other features and advantages of the present invention will become apparent from the following detailed description of the invention made with reference to the accompanying drawings.

DETAILED DESCRIPTION OF THE INVENTION

Figure 1:
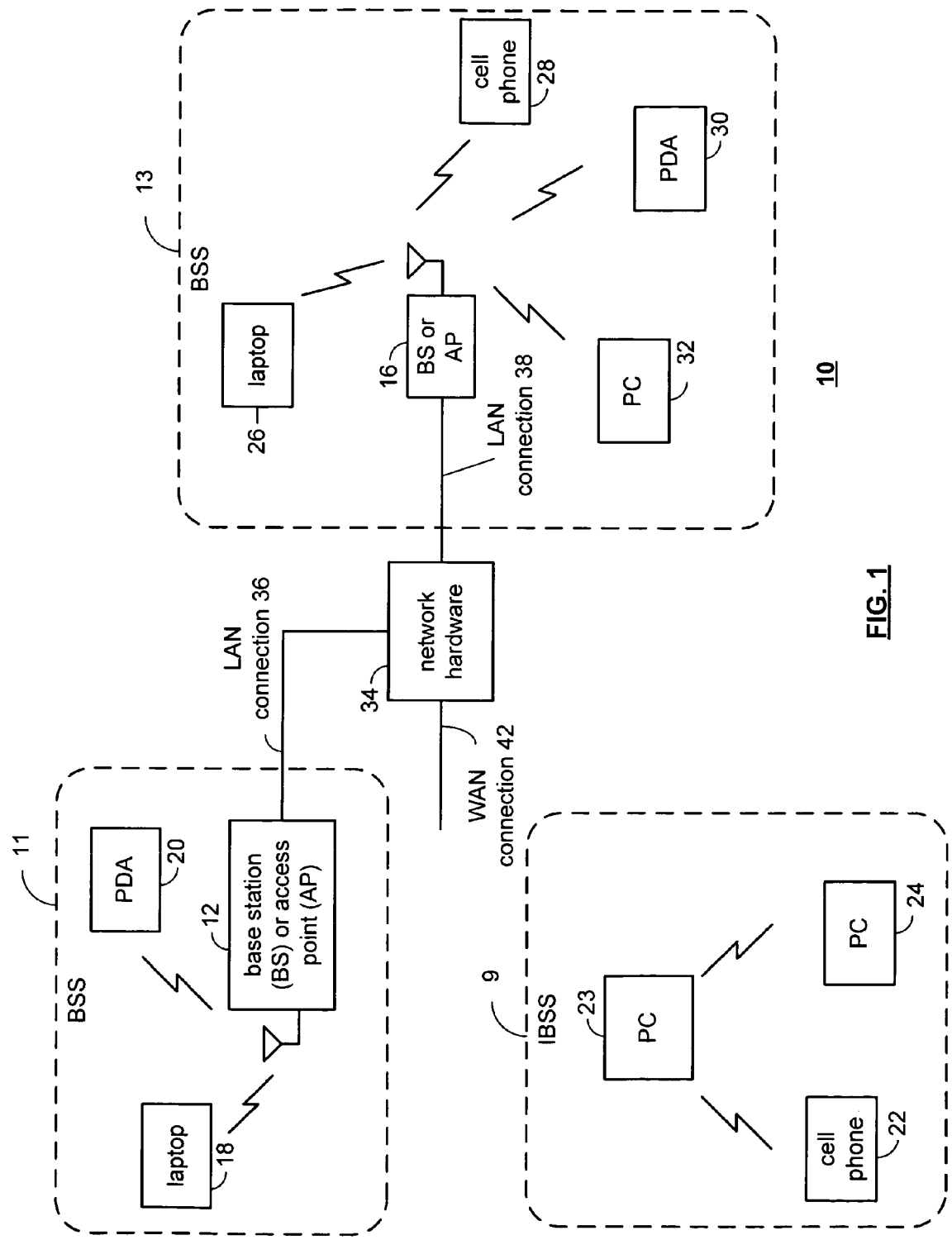
FIG. 1 is a schematic block diagram illustrating a wireless communication system in accordance with the present invention.

FIG. 1 is a schematic block diagram illustrating a communication system 10 that includes a plurality of base stations and/or access points 12, 16, a plurality of wireless communication devices 18-32 and a network hardware component 34.

Note that the network hardware 34, which may be a router, switch, bridge, modem, system controller, et cetera, provides a wide area network connection 42 for the communication system 10. Further note that the wireless communication devices 18-32 may be laptop host computers 18 and 26, personal digital assistant hosts 20 and 30, personal computer hosts 24 and 32, and/or cellular telephone hosts 22 and 28. The details of the wireless communication devices will be described in greater detail with reference to FIGS. 2 and/or 3.

Wireless communication devices 22, 23, and 24 are located within an independent basic service set (IBSS) area and communicate directly (i.e., point to point). In this configuration, these devices 22, 23, and 24 may only communicate with each other. To communicate with other wireless communication devices within the system 10 or to communicate outside of the system 10, the devices 22, 23, and/or 24 need to affiliate with one of the base stations or access points 12 or 16.

The base stations or access points 12, 16 are located within basic service set (BSS) areas 11 and 13, respectively, and are operably coupled to the network hardware 34 via local area network connections 36, 38. Such a connection provides the base station or access point 12 16 with connectivity to other devices within the system 10 and provides connectivity to other networks via the WAN connection 42. To communicate with the wireless communication devices within its BSS 11 or 13, each of the base stations or access points 12-16 has an associated antenna or antenna array. For instance, base station or access point 12 wirelessly communicates with wireless communication devices 18 and 20 while base station or access point 16 wirelessly communicates with wireless communication devices 26-32. Typically, the wireless communication devices register with a particular base station or access point 12, 16 to receive services from the communication system 10.

Typically, base stations are used for cellular telephone systems (e.g., GSM, GPRS, EDGE, WCDMA, 1xRTT, 1xEV-DO, 1xEV-DV, etc.) and like-type systems, while access points are used for in-home or in-building wireless networks (e.g., IEEE 802.11 and versions thereof, Bluetooth, and/or any other type of radio frequency based network protocol). Regardless of the particular type of communication system, each wireless communication device includes a built-in radio and/or is coupled to a radio.

Figure 2:
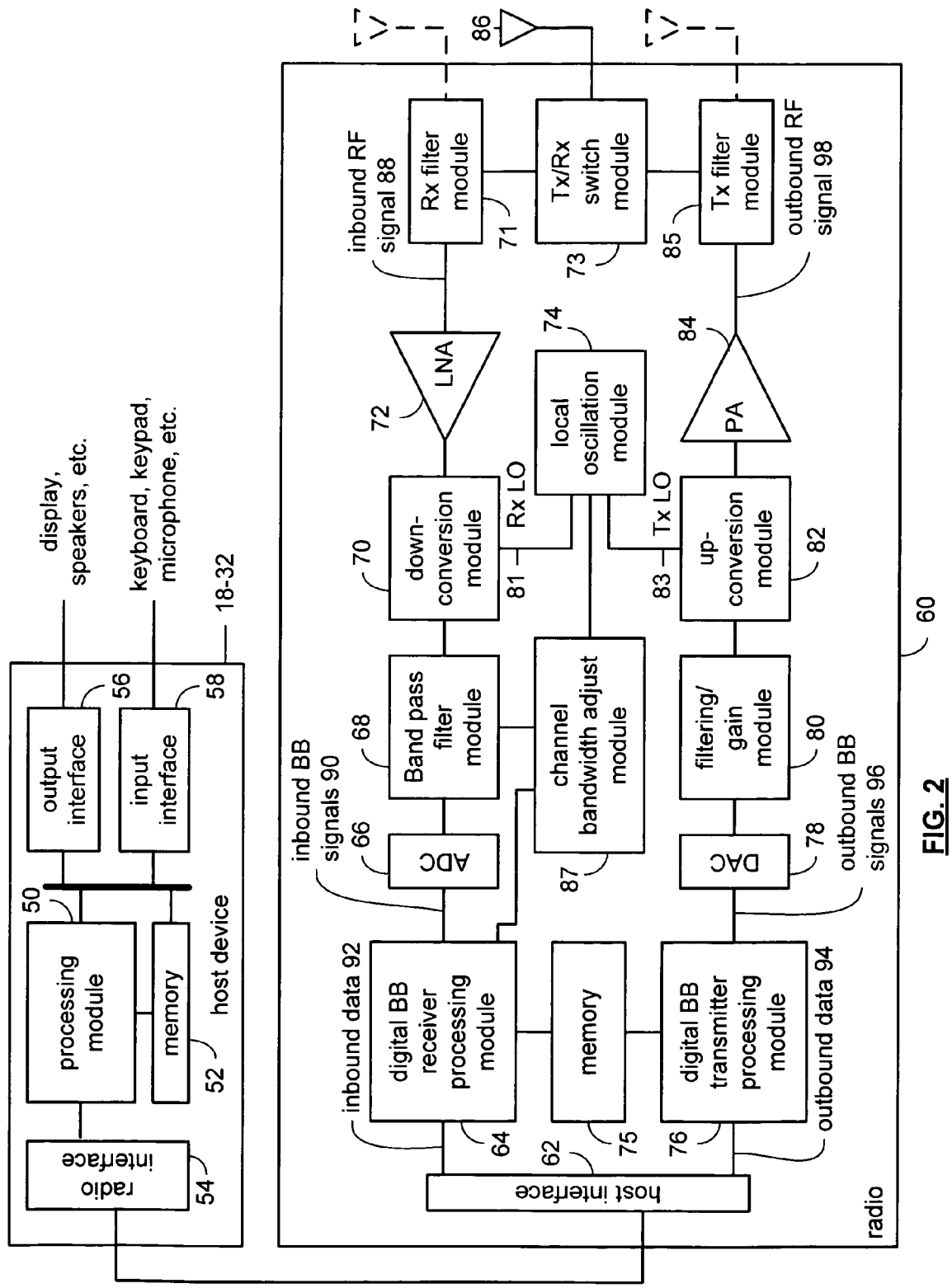
FIG. 2 is a schematic block diagram illustrating a wireless communication device in accordance with the present invention.

FIG. 2 is a schematic block diagram illustrating a wireless communication device that includes the host device 18-32 and an associated radio 60. For cellular telephone hosts, the radio 60 is a built-in component. For personal digital assistants hosts, laptop hosts, and/or personal computer hosts, the radio 60 may be built-in or an externally coupled component.

As illustrated, the host device 18-32 includes a processing module 50, memory 52, a radio interface 54, an input interface 58, and an output interface 56. The processing module 50 and memory 52 execute the corresponding instructions that are typically done by the host device. For example, for a cellular telephone host device, the processing module 50 performs the corresponding communication functions in accordance with a particular cellular telephone standard.

The radio interface 54 allows data to be received from and sent to the radio 60. For data received from the radio 60 (e.g., inbound data), the radio interface 54 provides the data to the processing module 50 for further processing and/or routing to the output interface 56. The output interface 56 provides connectivity to an output display device such as a display, monitor, speakers, et cetera such that the received data may be displayed. The radio interface 54 also provides data from the processing module 50 to the radio 60. The processing module 50 may receive the outbound data from an input device such as a keyboard, keypad, microphone, et cetera via the input interface 58 or generate the data itself. For data received via the input interface 58, the processing module 50 may perform a corresponding host function on the data and/or route it to the radio 60 via the radio interface 54.

Radio 60 includes a host interface 62, digital receiver processing module 64, an analog-to-digital converter 66, a band pass filter module 68, an IF mixing down conversion stage 70, a receiver filter 71, a low noise amplifier 72, a transmitter/receiver switch 73, a local oscillation module 74, memory 75, a digital transmitter processing module 76, a digital-to-analog converter 78, a filtering/gain module 80, an IF mixing up conversion stage 82, a power amplifier 84, a transmitter filter module 85, a channel bandwidth adjust module 87, and an antenna 86. The antenna 86 may be a single antenna that is shared by the transmit and receive paths as regulated by the TX/RX switch 73, or may include separate antennas for the transmit path and receive path. The antenna implementation will depend on the particular standard to which the wireless communication device is compliant.

The digital receiver processing module 64 and the digital transmitter processing module 76, in combination with operational instructions stored in memory 75, execute digital receiver functions and digital transmitter functions, respectively. The digital receiver functions include, but are not limited to, digital intermediate frequency to baseband conversion, demodulation, constellation demapping, decoding, and/or descrambling. The digital transmitter functions include, but are not limited to, scrambling, encoding, constellation mapping, modulation, and/or digital baseband to IF conversion. The digital receiver and transmitter processing modules 64 and 76 may be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 75 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 64 and/or 76 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

In operation, the radio 60 receives outbound data 94 from the host device via the host interface 62. The host interface 62 routes the outbound data 94 to the digital transmitter processing module 76, which processes the outbound data 94 in accordance with a particular wireless communication standard (e.g., IEEE 802.11, Bluetooth, et cetera) to produce outbound baseband signals 96. The outbound baseband signals 96 will be digital base-band signals (e.g., have a zero IF) or a digital low IF signals, where the low IF typically will be in the frequency range of one hundred kilohertz to a few megahertz.

The digital-to-analog converter 78 converts the outbound baseband signals 96 from the digital domain to the analog domain. The filtering/gain module 80 filters and/or adjusts the gain of the analog signals prior to providing it to the IF mixing stage 82. The IF mixing stage 82 converts the analog baseband or low IF signals into RF signals based on a transmitter local oscillation 83 provided by local oscillation module 74. The power amplifier 84 amplifies the RF signals to produce outbound RF signals 98, which are filtered by the transmitter filter module 85. The antenna 86 transmits the outbound RF signals 98 to a targeted device such as a base station, an access point, and/or another wireless communication device.

The radio 60 also receives inbound RF signals 88 via the antenna 86, which were transmitted by a base station, an access point, or another wireless communication device. The antenna 86 provides the inbound RF signals 88 to the receiver filter module 71 via the TX/RX switch 73, where the RX filter 71 band pass filters the inbound RF signals 88. The RX filter 71 provides the filtered RF signals to low noise amplifier 72, which amplifies the signals 88 to produce an amplified inbound RF signals. The low noise amplifier 72 provides the amplified inbound RF signals to the IF mixing module 70, which directly converts the amplified inbound RF signals into an inbound low IF signals or baseband signals based on a receiver local oscillation 81 provided by local oscillation module 74. The down conversion module 70 provides the inbound low IF signals or baseband signals to the band pass filter module 68. The band pass filter module 68, based on settings provided by the channel bandwidth adjust module 87, filters the inbound low IF signals or the inbound baseband signals to produce filtered inbound signals.

The analog-to-digital converter 66 converts the filtered inbound signals from the analog domain to the digital domain to produce inbound baseband signals 90, where the inbound baseband signals 90 will be digital base-band signals or digital low IF signals, where the low IF typically will be in the frequency range of one hundred kilohertz to a few megahertz. The digital receiver processing module 64, based on settings provided by the channel bandwidth adjust module 87, decodes, descrambles, demaps, and/or demodulates the inbound baseband signals 90 to recapture inbound data 92 in accordance with the particular wireless communication standard being implemented by radio 60. The host interface 62 provides the recaptured inbound data 92 to the host device 18-32 via the radio interface 54.

As one of average skill in the art will appreciate, the wireless communication device of FIG. 2 may be implemented using one or more integrated circuits. For example, the host device may be implemented on one integrated circuit, the digital receiver processing module 64, the digital transmitter processing module 76 and memory 75 may be implemented on a second integrated circuit, and the remaining components of the radio 60, less the antenna 86, may be implemented on a third integrated circuit. As an alternate example, the radio 60 may be implemented on a single integrated circuit. As yet another example, the processing module 50 of the host device and the digital receiver and transmitter processing modules 64 and 76 may be a common processing device implemented on a single integrated circuit. Further, the memory 52 and memory 75 may be implemented on a single integrated circuit and/or on the same integrated circuit as the common processing modules of processing module 50 and the digital receiver and transmitter processing module 64 and 76.

Figure 3:
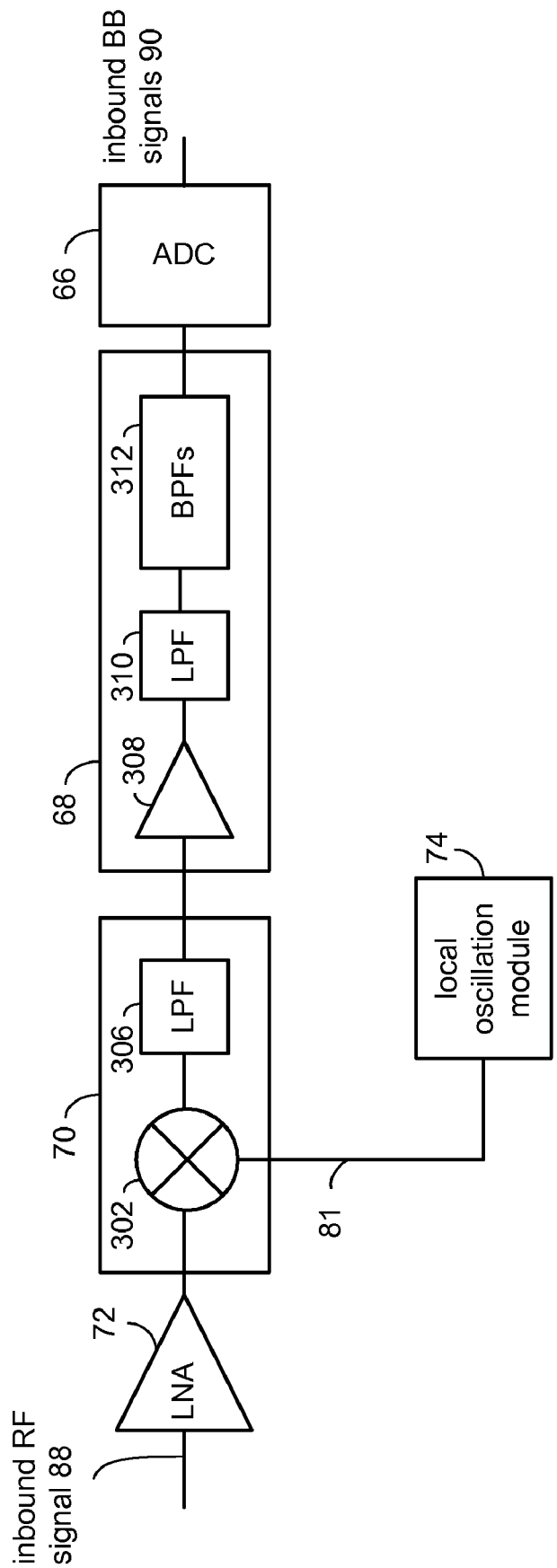
FIG. 3 is a block diagram illustrating a multiple stage band pass filter of a radio frequency (RF) integrated circuit constructed according to an embodiment of the present invention.

FIG. 3 is a block diagram illustrating a multiple stage band pass filter of a radio frequency (RF) integrated circuit constructed according to an embodiment of the present invention. As shown in FIG. 3, the multiple stage band pass filter includes components that may be referred to with regard to the down conversion module 70 and the band pass filter module 68, both of these elements described with reference to FIG. 2. Also shown in FIG. 3 are the LNA 72, the ADC 66, and the local oscillation module 74. According to the embodiment of FIG. 3, the multiple stage band pass filter includes a low pass mixer output filter 306 operably coupled to receive a down sampled analog information signal from the output of mixer 302. Mixer 302 receives an Rx LO signal 81 from the local oscillation module 74 and mixes the RX LO signal 81 with the inbound RF signal 88 after the inbound RF signal 88 has been amplified by LNA 72 to produce the down sampled analog information signal.

The multiple stage band pass filter further includes a buffer 308 communicatively coupled to an output of the low pass mixer output filter 306 and a low pass buffer output filter 310 communicatively coupled to an output of the buffer 308. Further, the multiple stage band pass filter includes a plurality of band pass filters 312 communicatively coupled to an output of the low pass buffer output filter 310. The manner in which the element of the multiple stage band pass filter are set will be described subsequently herein with reference to FIG. 10. The ADC 66 receives the output of the plurality of band pass filters 312.

According to one aspect of the present invention, the low pass mixer output filter 306, the low pass buffer output filter 310, and the plurality of band pass filters 312 are operable to be tuned to meet out-of-channel and out-of-band blocking requirements of the RF integrated circuit. Further, the low pass mixer output filter 306, the low pass buffer output filter 310, and the plurality of band pass filters 312 are operable to be tuned to meet in channel gain requirements. The manner in which these elements may be tuned depends upon their particular constructs. Various constructs of the components of the multiple state band pass filter will be described with reference to FIGS. 5-9. The embodiment of FIG. 3 could also be constructed in a differential manner by extending the teachings of FIG. 3 to such differential construct.

Figure 4:
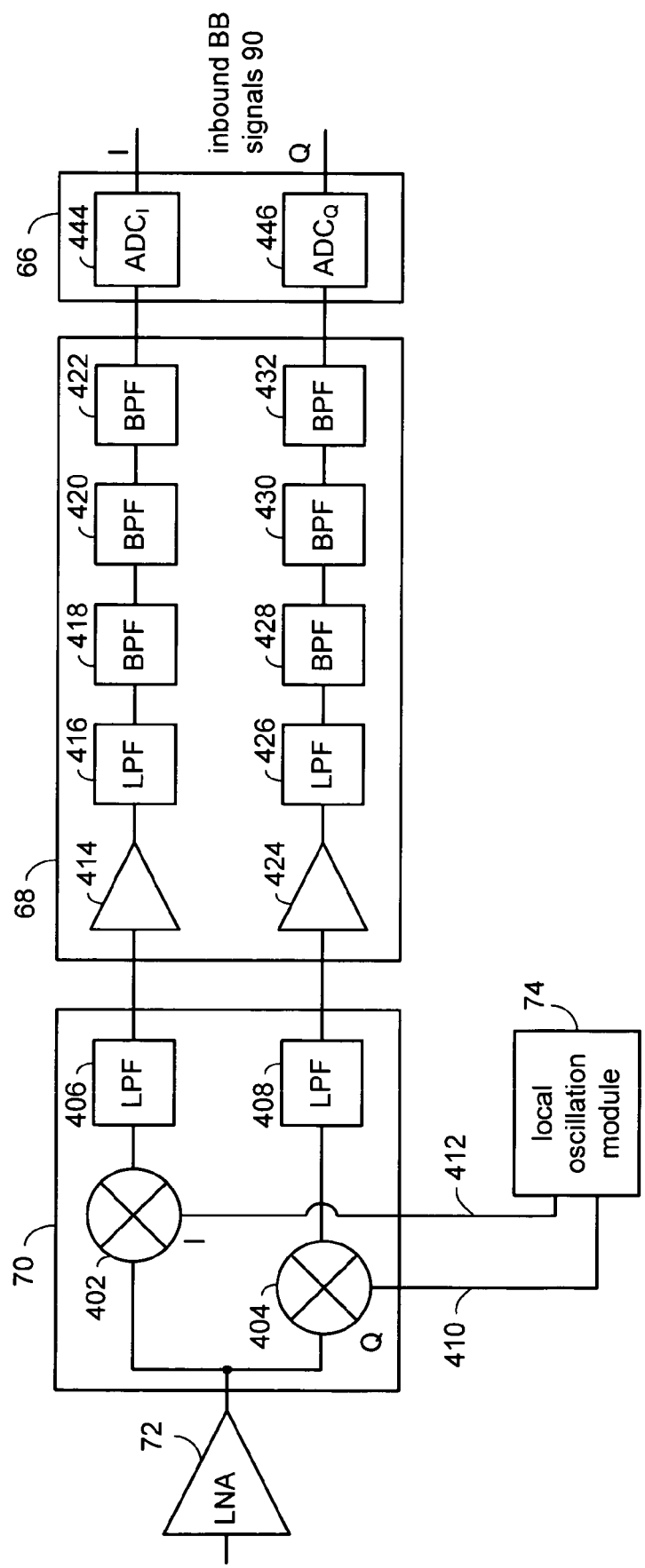
FIG. 4 is a block diagram illustrating an embodiment of a band pass filter constructed according to the present invention.

FIG. 4 is a block diagram illustrating an embodiment of a band pass filter constructed according to the present invention. As distinguished from the construct of FIG. 3, the multi-stage band pass filter illustrated in FIG. 4 includes in-phase (I) and quadrature (Q) components. With the structure of FIG. 4, the multiple stage band pass filter includes an I branch low pass mixer output filter 406 operable to receive an I component of a down sampled analog information signal from an I component 402 of mixer 70. Further, the multiple stage band pass filter includes a Q branch low pass mixer output filter 408 operable to receive a Q component of the down sampled analog information signal from a Q component 404 of mixer 70. As is further shown, the in-phase component 402 of mixer 70 receives local oscillation in-phase component 412 from local oscillation module 74. Further, the quadrature component 404 of the mixer 70 receives a quadrature component from a local oscillation 410 produced by local oscillation module 74.

The multiple stage band pass filter further includes an I branch buffer 414 communicatively coupled to an output of the I branch low pass mixer output filter 406. Following along on the I branch of the multiple stage band pass filter, the multiple stage band pass filter includes an I branch low pass buffer output filter 416 communicatively coupled to an output of the I branch buffer 414. Further, the I branch of the multiple stage band pass filter includes a plurality of I branch band pass filters 418, 420, and 422 that are communicatively coupled to an output of the I branch low pass buffer output filter 416. The output of the last I branch band pass filter 422 is received by I branch ADC component 444 of ADC 66 to produce an in-phase component of the inbound baseband signals 90.

Following along with the Q branch of the multiple stage band pass filter, the multiple phase band pass filter includes a Q branch buffer 424 communicatively coupled to an output of the Q branch low pass mixer output filter 408. Further included is a Q branch low pass buffer output filter 424 communicatively coupled to an output of the Q branch buffer 424 and a plurality of Q branch band pass filters 428, 430, and 432 communicatively coupled to an output of the Q branch low pass buffer output filter 426. As is shown, the output of Q branch band pass filter 432 is received by ADC Q component 446 of the ADC 66, which produces the Q component of the inbound baseband signals 90.

The I branch low pass mixer output filter 406, the I branch low pass buffer output filter 416, and the plurality of I branch band pass filters 418, 420, and 422 are operable to be tuned to meet out-of-channel and out-of-band blocking requirements. Further, the I branch low pass mixer output filter 406, the I branch low pass buffer output filter 416, and the plurality of I branch band pass filters 418, 420 and 422 are operable to be tuned to meet an in-channel gain requirement. The Q branch low pass mixer output filter 408, the Q branch low pass buffer output filter 426, and the plurality of Q branch band pass filters 428, 430 and 432 are operable to be tuned to meet the out-of-channel and the out-of-band blocking requirements of the RF integrated circuit. Moreover, the Q branch low pass mixer output filter 408, the Q branch low pass buffer output filter 426, and the plurality of Q branch band pass filters 428, 430 and 432 are operable to be tuned to meet the in-channel gain requirements. The embodiment of FIG. 4 could also be constructed in a differential manner by extending the teachings of FIG. 4 to such differential construct.

Figure 5:
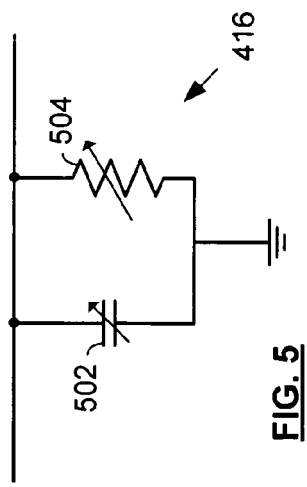
FIG. 5 is a schematic diagram illustrating one construct of the low pass mixer output filter, the low pass buffer output filter, or any of the I or Q low pass filters of FIG. 4.

FIG. 5 is a schematic diagram illustrating one construct of the low pass mixer output filter 306, the low pass buffer output filter 310 of FIG. 3 or any of the I or Q low pass filters 406, 408, 416, or 426 of FIG. 4. As is shown, any of these low pass filters, e.g., 416, can be implemented as an RC filter having a variable capacitor 502 and/or a variable resistor 504. According to the construct of FIG. 5, a corner of the low pass mixer output filter 416 may be set by setting a value of the variable capacitor 502 or by setting the value of the variable resistor 504. As is generally known, variable resistors and variable capacitors may be formed in integrated circuits and be coupled such that they are controllable by control signals.

Figure 6:
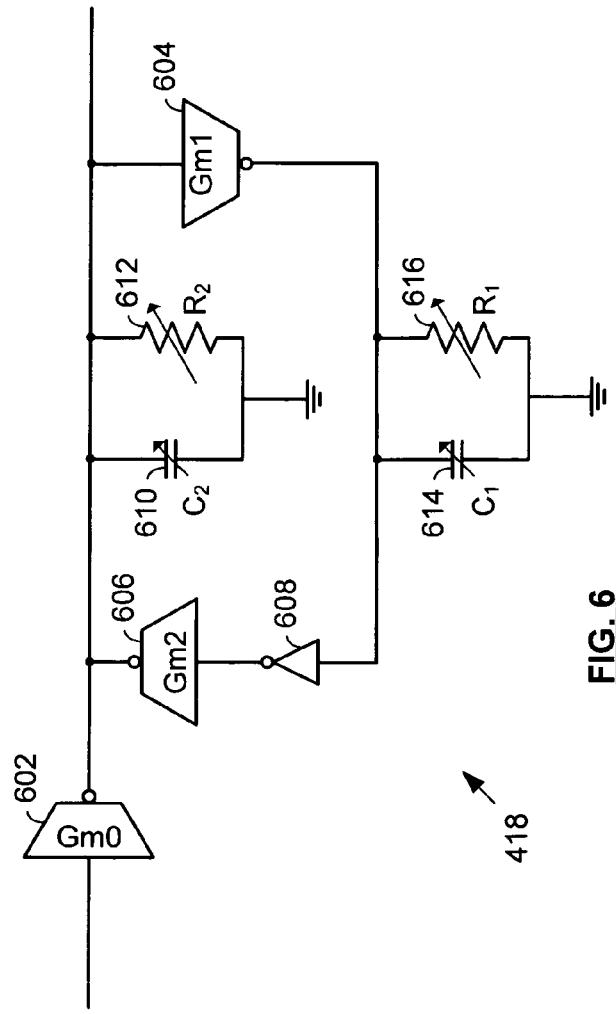
FIG. 6 is a schematic diagram illustrating an embodiment of a band pass filter constructed according to an embodiment of the present invention.

FIG. 6 is a schematic diagram illustrating an embodiment of a band pass filter 418 constructed according to an embodiment of the present invention. This band pass filter 418 may form a portion of band pass filter 312 of FIG. 3 or any other of the band pass filters 420, 422, 428, 430, or 432 of FIG. 4. As is shown, the band pass filter 418 includes transconductance devices 602, 604, and 606. Examples of transconductance devices are illustrated further in FIGS. 8 and 9. The band pass filter 418 further includes inverter 608, variable capacitors 610 and 614, and variable resistors 612 and 616. Depending upon the embodiment, the band pass filter 418 may include the variable resistors 612 and 616 and/or the variable capacitors 610 and 614. In other embodiments other various constructs may be employed.

$$H(s) = -\frac{G_{m0}R_2}{C_1^2 R_1^2 C_2 R_2} \cdot \frac{s + \frac{1}{C_1 R_1}}{s^2 + s \cdot \frac{C_1 R_1 + C_2 R_2}{C_1 R_1 C_2 R_2} + \frac{G_{m1}G_{m2}R_1R_2 + 1}{C_1 R_1 C_2 R_2}} \quad \text{Eq. (1)}$$

$$Z_1 = -\frac{1}{C_1 R_1} \quad \text{Eq. (2)}$$

$$P_{1,2} = -\frac{1}{2C_2 R_2} \pm j\sqrt{-\frac{1}{4C_2^2 R_2^2} + \frac{G_{m1}G_{m2}}{C_1 C_2}}, \text{ as } R_1 \to \infty \quad \text{Eq. (3)}$$

$$\text{Gain} = \frac{G_{m0}R_2}{C_1^2 R_1^2 (G_{m1}G_{m2}R_1R_2 + 1)} \quad \text{Eq. (4)}$$

Equation 1 describes the transfer function of the band pass filter 418. Equation 2 describes the zero of the transfer function and how the zero may be set by setting the values $C_1$ and $R_1$. Equation 3 describes the poles of the band pass filter 418 and how the poles may be set by altering the values of $C_1$, $C_2$, $R_1$, and $R_2$ and the transconductance value of devices 604 and 606. Finally, Equation 4 describes the gain of the transfer function, which is alterable by varying $C_1$, $R_1$, $R_2$, Gm0 602, Gm1 604, and Gm2 606.

Figure 7:
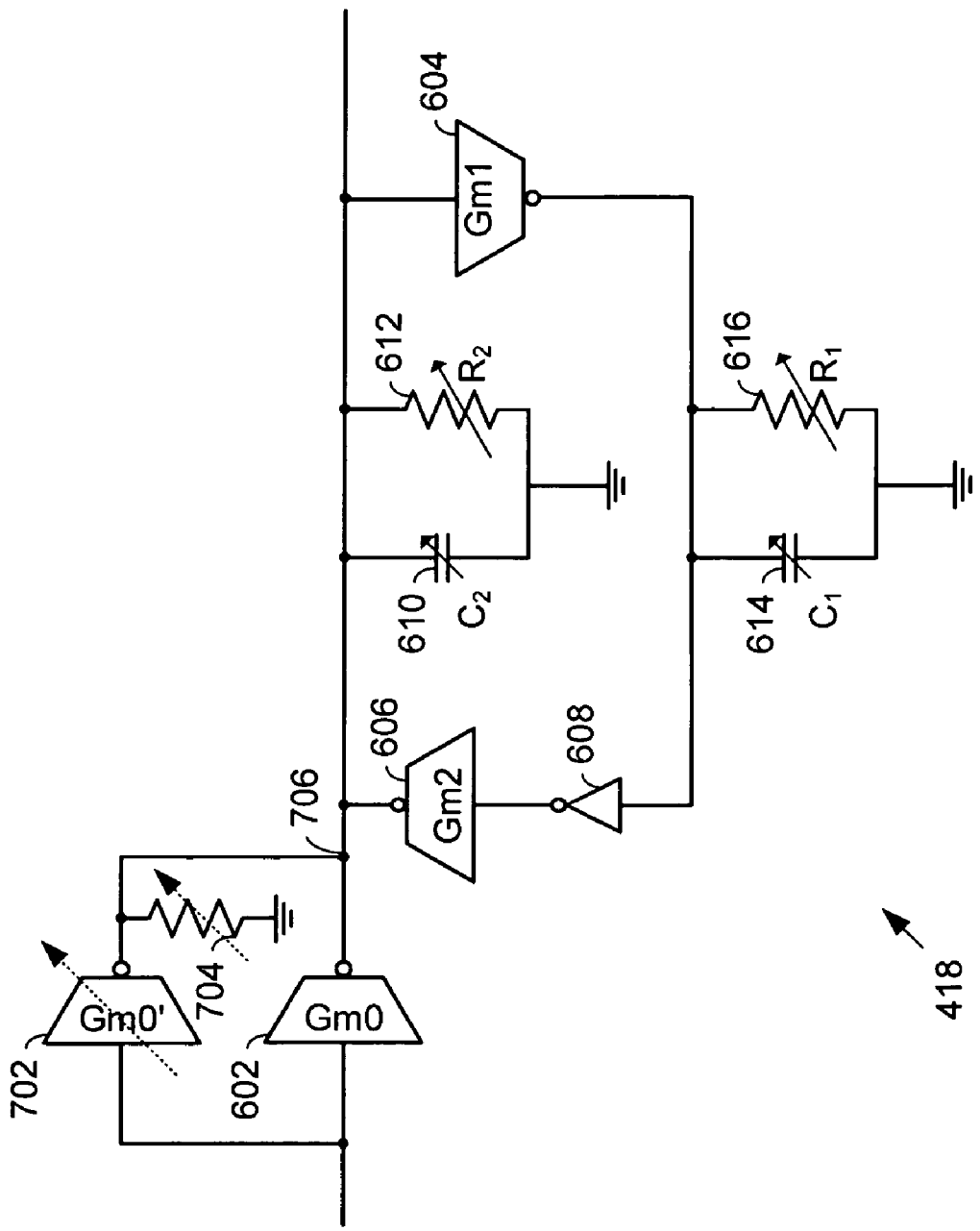
FIG. 7 is a schematic block diagram illustrating another band pass filter having a gain control scheme constructed according to an embodiment of the present invention.

FIG. 7 is a schematic block diagram illustrating another band pass filter with a gain control scheme constructed according to an embodiment of the present invention. Components common to the components of FIG. 6 have common numbering in FIG. 7. Thus, as contrasted to the construct of FIG. 6, the band pass filter 418 includes a controllable transconductance element 702 and finite output resistance 704. This controllable transconductance element 802 may be selectively enabled or disabled to set the combined gain of the combination of the low pass mixer output filter, the low pass buffer output filter, and the plurality of band pass filters of the multiple stage band pass filter of the present invention. Generally, with reference to equation 4, the numerator term Gm0 is increased or decreased by selectively enabling or disabling transconductance element 802 to thereby increase or decrease the overall gain of the multiple stage band pass filter. Note that the resistance at node 706 changes with the gain state of the controllable transconductance 702. Thus, the resistance of $R_2$ 612 must be adjusted based upon the gain state of controllable transconductance 702 that the combined parallel resistance of $R_2$ 612 and the output resistance at node 706 is constant to keep the pole location(s) unchanged for the differing gain settings.

Figure 8:
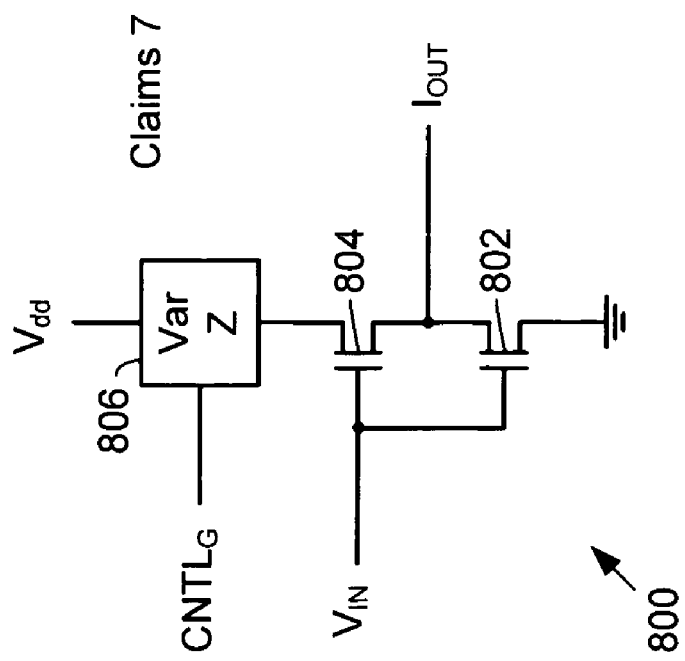
FIG. 8 is a schematic diagram illustrating a transconductance element constructed according to an embodiment of the present invention.

FIG. 8 is a schematic diagram illustrating a transconductance element constructed according to an embodiment of the present invention. The transconductance element 800 may be employed as any of the transconductance elements 602, 604, and 606 of FIGS. 6 and 7. The transconductance element 800 includes transistors 802, 804, and a variable impedance element 806 coupled as illustrated. The transconductance element 800 receives an input voltage $V_{IN}$ and produces an output current $I_{OUT}$. By controlling the impedance of variable impedance element 806 with control signal $CNTL_G$, the gain of the transconductance device 800 is alterable. Transistors 802 and 804 may be N-channel field effect transistors, P-channel field effect transistors or another type of field effect transistor. In alternate constructs, these transistors 802 and 804 may include P-channel field effect transistors, bipolar junction transistors, or other types of semi conductive elements capable of providing a transconductance function.

Figure 9:
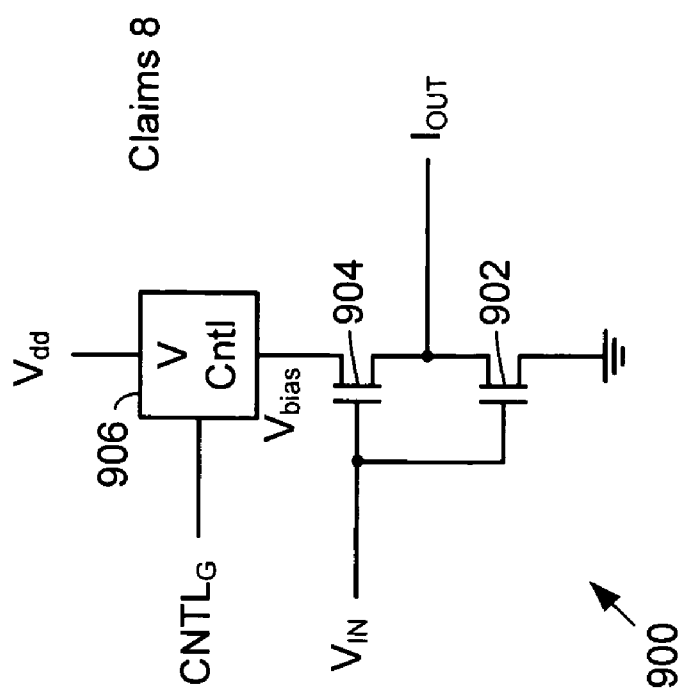
FIG. 9 is a schematic diagram illustrating another transconductance element constructed according to an embodiment of the present invention.

FIG. 9 is a schematic diagram illustrating another transconductance element constructed according to an embodiment of the present invention. Transconductance element 900 includes transistor 902, transistor 904, and voltage control element 906. Voltage control element 906 receives a rail voltage $V_{DD}$ and a control input signal $CNTL_G$. Based upon the control input signals $CNTL_G$, the voltage control element 906 varies the bias voltage $V_{bias}$ applied to the source of transistor 904, effectively altering the gain of the transconductance element 900. Of course, similar structures could be employed to also create the transconductance element having a variable gain.

Figure 10:
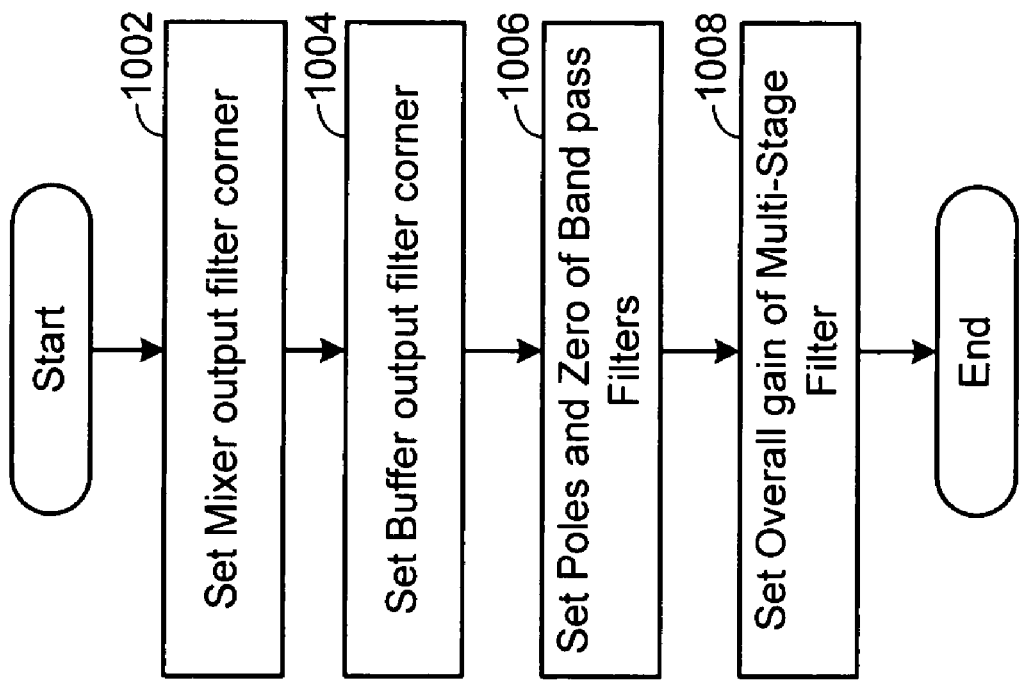
FIG. 10 is a flow chart illustrating an embodiment of the present invention for configuring a multiple stage band pass filter of a radio frequency receiver.

FIG. 10 is a flow chart illustrating an embodiment of the present invention for configuring a multiple stage band pass filter of a radio frequency receiver. Operation commences by setting a corner of a low pass mixer output filter that receives a down sampled analog information signal (Step 1002). Operation continues with setting a buffer output filter corner of a low pass buffer output filter coupled to an output of low pass mixer output filter via a buffer (Step 1004). Then, operation includes setting the poles and zero of a plurality of band pass filters coupled to the output of the low pass buffer output filter is performed (Step 1006). This operation includes first setting a zero of a respected band pass filter and then setting the plurality of poles of the band pass filter. The operations of Step 1006 are performed for each of the plurality of band pass filters. Finally, operation concludes with setting a combined gain of the combination of the low pass mixer output filter, the low pass buffer output filter, and the plurality of band pass filters (Step 1008). The operations of Steps 1002 1008 may be performed with any of the various structures illustrated in FIGS. 3-9 as was previously described herein.

Figure 11:
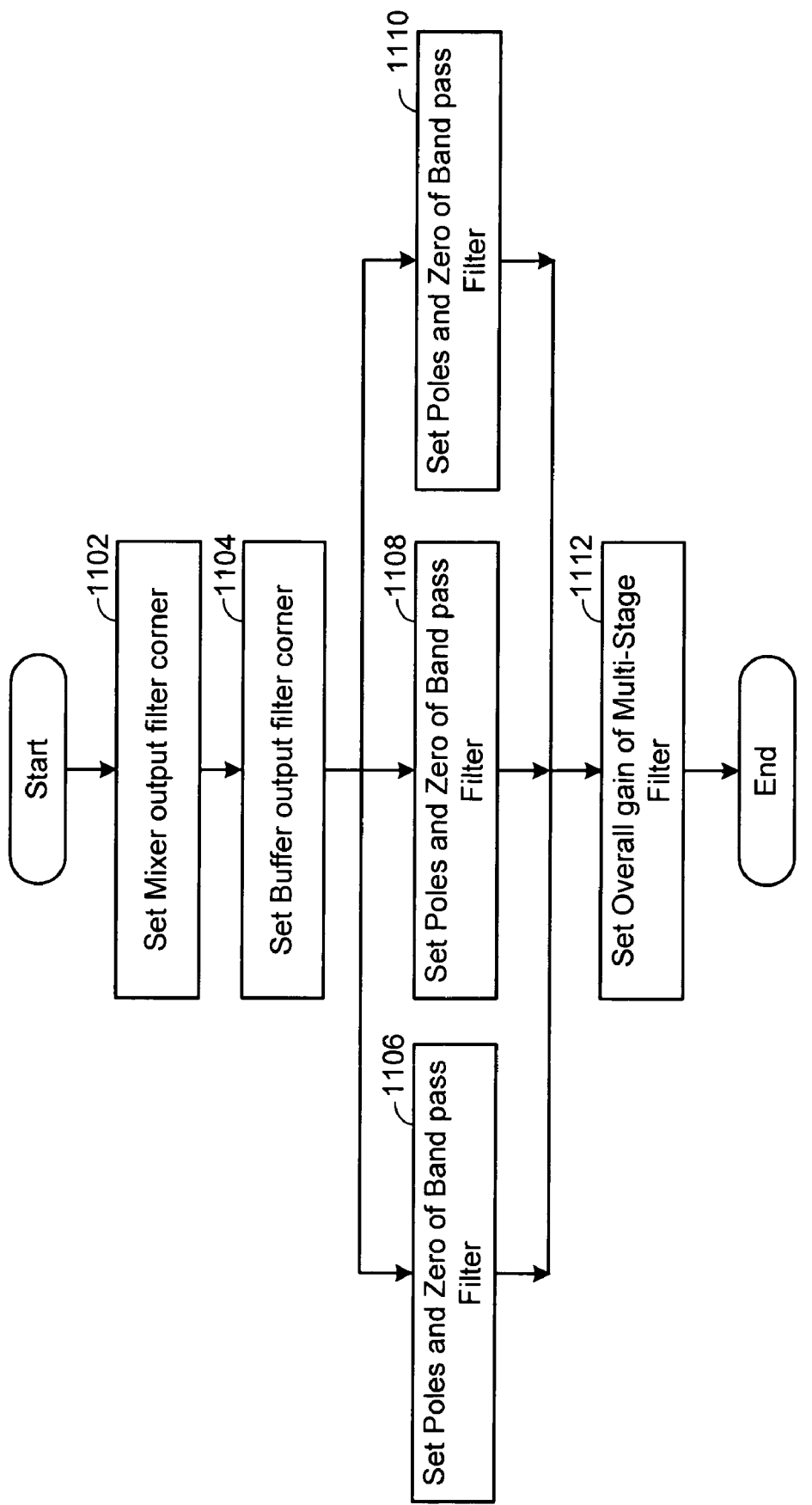
FIG. 11 is a flow chart illustrating another embodiment of the present invention for configuring a multiple stage band pass filter of a radio frequency receiver.

FIG. 11 is a flow chart illustrating another embodiment of the present invention for configuring a multiple stage band pass filter of a radio frequency receiver. Operation commences with setting a corner of the low pass mixer output filter that receives a down sampled analog information signal (Step 1102). Operation continues with setting a corner of the low pass buffer output filter that couples to an output of the low pass mixer output filter via buffer (Step 1104). Then, for each of the plurality of band pass filters coupled to an output low pass buffer output filter, operation includes setting poles and zeros of the band pass filter (Steps 1106, 1108, and 1110). As shown in FIG. 11, these steps are performed in parallel and a number of steps performed correspond to the number of band pass filters of the multiple stage band pass filter of the RF receiver. With the poles and zeros of a band pass filters set at Steps 1106, 1108 and 1110, the overall gain of the multistage band pass filter is set (Step 1112). This gain is set according to one embodiment by varying the gain of one or more of the band pass filters. From Step 1112, operation ends.

As one of average skill in the art will appreciate, the term "communicatively coupled", as may be used herein, includes wireless and wired, direct coupling and indirect coupling via another component, element, circuit, or module. As one of average skill in the art will also appreciate, inferred coupling (i.e., where one element is coupled to another element by inference) includes wireless and wired, direct and indirect coupling between two elements in the same manner as "communicatively coupled".

The present invention has also been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention.

The present invention has been described above with the aid of functional building blocks illustrating the performance of certain significant functions. The boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention.

One of average skill in the art will also recognize that the functional building blocks, and other illustrative blocks, modules and components herein, can be implemented as illustrated or by discrete components, application specific integrated circuits, processors executing appropriate software and the like or any combination thereof.

Moreover, although described in detail for purposes of clarity and understanding by way of the aforementioned embodiments, the present invention is not limited to such embodiments. It will be obvious to one of average skill in the art that various changes and modifications may be practiced within the spirit and scope of the invention, as limited only by the scope of the appended claims

What is claimed is:

1. A method for configuring a multiple stage band pass filter of a Radio Frequency (RF) receiver comprising:
   setting a corner of a low pass mixer output filter that receives a down sampled analog information signal;
   setting a corner of a low pass buffer output filter coupled to an output of the low pass mixer output filter via a buffer;
   for each of a plurality of band pass filters coupled to an output of the low pass buffer output filter:
   setting a zero of the band pass filter; and
   setting a plurality of poles of the band pass filter; and
   setting a combined gain of the combination of the low pass mixer output filter, the low pass buffer output filter, and the plurality of band pass filters.

2. The method of claim 1, wherein setting the corner of the low pass mixer output filter that receives the down sampled analog information signal comprises setting a variable capacitor of the low pass mixer output filter.

3. The method of claim 1, wherein setting the corner of the low pass buffer output filter coupled to the output of the low pass mixer output filter via the buffer comprises setting a variable capacitor of the low pass buffer output filter.

4. The method of claim 1, wherein setting the zero of the band pass filter comprises setting at least one of a variable capacitor and a variable resistor of the band pass filter.

5. The method of claim 1, wherein setting the combined gain of the combination of the low pass mixer output filter, the low pass buffer output filter, and the plurality of band pass filters comprises setting a variable resistance of at least one of the plurality of band pass filters.

6. The method of claim 1, wherein setting the combined gain of the combination of the low pass mixer output filter, the low pass buffer output filter, and the plurality of band pass filters comprises enabling/disabling a transconductance element of at least one of the plurality of band pass filters.

7. The method of claim 1, wherein setting the combined gain of the combination of the low pass mixer output filter, the low pass buffer output filter, and the plurality of band pass filters comprises adjusting a biasing impedance of a transconductance element of at least one of the plurality of band pass filters.

8. The method of claim 1, wherein setting the combined gain of the combination of the low pass mixer output filter, the low pass buffer output filter, and the plurality of band pass filters comprises adjusting a biasing voltage of a transconductance element of at least one of the plurality of band pass filters.

9. A method for configuring a multiple stage band pass filter of a Radio Frequency (RF) receiver comprising:
   setting a corner of an I branch low pass mixer output filter that receives an I component of a down sampled analog information signal;
   setting a corner of a Q branch low pass mixer output filter that receives a Q component of the down sampled analog information signal;
   setting a corner of an I branch low pass buffer output filter coupled to an output of the I branch low pass mixer output filter via an I branch buffer;
   setting a corner of a Q branch low pass buffer output filter coupled to an output of the Q branch low pass mixer output filter via a Q branch buffer;
   for each of a plurality of I branch band pass filters coupled to an output of the I branch low pass buffer output filter:
      setting a zero of an I branch of the band pass filter; and
      setting a plurality of poles of the I branch of the band pass filter;
   for each of a plurality of Q branch band pass filters coupled to an output of the Q branch low pass buffer output filter:
      setting a zero of a Q branch of the band pass filter; and
      setting a plurality of poles of the Q branch of the band pass filter;
   setting a combined gain of the combination of the I branch low pass mixer output filter, the I branch low pass buffer output filter, and the plurality of I branch band pass filters; and
   setting a combined gain of the combination of the Q branch low pass mixer output filter, the Q branch low pass buffer output filter, and the plurality of Q branch band pass filters.

10. The method of claim 9, wherein:
   setting the corner of the I branch low pass mixer output filter comprises setting a variable capacitor of the I branch low pass mixer output filter; and
   setting the corner of the Q branch low pass mixer output filter comprises setting a variable capacitor of the Q branch low pass mixer output filter.

11. The method of claim 9, wherein:
   setting the corner of the I branch low pass buffer output filter comprises setting a variable capacitor of the I branch low pass buffer output filter; and
   setting the corner of the Q branch low pass buffer output filter comprises setting a variable capacitor of the Q branch low pass buffer output filter.

12. The method of claim 9, wherein:
   setting the zero of the I branch band pass filter comprises setting at least one of a variable capacitor or a variable resistor of the I branch band pass filter; and
   setting the zero of the Q branch band pass filter comprises setting at least one of a variable capacitor or a variable resistor of the Q branch band pass filter.

13. The method of claim 9, wherein setting the combined gain of the combination of the I or Q branch low pass mixer output filter, the I or Q branch low pass buffer output filter, and the plurality of I or Q branch band pass filters comprises setting a variable resistance of at least one of the plurality of band pass filters.

14. The method of claim 9, wherein:
   setting the combined gain of the combination of the I branch low pass mixer output filter, the I branch low pass buffer output filter, and the plurality of I branch band pass filters comprises enabling/disabling a transconductance element of at least one of the plurality of I branch band pass filters; and
   setting the combined gain of the combination of the Q branch low pass mixer output filter, the Q branch low pass buffer output filter, and the plurality of Q branch band pass filters comprises enabling/disabling a transconductance element of at least one of the plurality of Q branch band pass filters.

15. The method of claim 9, wherein:
   setting the combined gain of the combination of the I branch low pass mixer output filter, the I branch low pass buffer output filter, and the plurality of I branch band pass filters comprises adjusting a biasing impedance of a transconductance element of at least one of the plurality of I branch band pass filters; and
   setting the combined gain of the combination of the Q branch low pass mixer output filter, the Q branch low pass buffer output filter, and the plurality of Q branch band pass filters comprises adjusting a biasing impedance of a transconductance element of at least one of the plurality of Q branch band pass filters.

16. The method of claim 9, wherein:
   setting the combined gain of the combination of the I branch low pass mixer output filter, the I branch low pass buffer output filter, and the plurality of I branch band pass filters comprises adjusting a biasing voltage of a transconductance element of at least one of the plurality of I branch band pass filters; and
   setting the combined gain of the combination of the Q branch low pass mixer output filter, the Q branch low pass buffer output filter, and the plurality of Q branch band pass filters comprises adjusting a biasing voltage of a transconductance element of at least one of the plurality of Q branch band pass filters.

17. A multiple stage band pass filter of a Radio Frequency (RF) Integrated Circuit comprising:
   an I branch low pass mixer output filter operable to receive an I component of a down sampled analog information signal;
   an I branch buffer communicatively coupled to an output of the I branch low pass mixer output filter;
   an I branch low pass buffer output filter communicatively coupled to an output of the I branch buffer;
   a plurality of I branch band pass filters communicatively coupled to an output of the I branch low pass buffer output filter;
   wherein the I branch low pass mixer output filter, the I branch low pass buffer output filter, and the plurality of I branch band pass filters are operable to be tuned to meet out of channel and out of band blocking requirements;
   wherein the I branch low pass mixer output filter, the I branch low pass buffer output filter, and the plurality of I branch band pass filters are operable to be tuned to meet an in-channel gain requirement;
   a Q branch low pass mixer output filter operable to receive a Q component of the down sampled analog information signal;
   a Q branch buffer communicatively coupled to an output of the Q branch low pass mixer output filter;

a Q branch low pass buffer output filter communicatively coupled to an output of the Q branch buffer;

a plurality of Q branch band pass filters communicatively coupled to an output of the Q branch low pass buffer output filter:

wherein the Q branch low pass mixer output filter, the Q branch low pass buffer output filter, and the plurality of Q branch band pass filters are operable to be tuned to meet the out of channel and the out of band blocking requirements; and wherein the Q branch low pass mixer output filter, the Q branch low pass buffer output filter, and the plurality of Q branch band pass filters are operable to be tuned to meet the in-channel gain requirement.

18. The multiple stage band pass filter of claim 17, wherein:

at least one of the plurality of I branch band pass filters comprises a plurality of transconductance elements and at least one low pass filter; and at least one of the plurality of Q branch band pass filters comprises a plurality of transconductance elements and at least one low pass filter.

19. The multiple stage band pass filter of claim 18, wherein:

one of the transconductance elements of the plurality of I branch band pass filters is operable to be enabled/disabled to adjust a gain of the corresponding I branch band pass filter; and one of the transconductance elements of the plurality of Q branch band pass filters is operable to be enabled/disabled to adjust a gain of the corresponding Q branch band pass filter.

20. The multiple stage band pass filter of claim 18, wherein:

one of the transconductance elements of the plurality of I branch band pass filters is operable to have its biasing impedance altered to adjust a gain of the corresponding I branch band pass filter; and one of the transconductance elements of the plurality of Q branch band pass filters is operable to have its biasing impedance altered to adjust a gain of the corresponding Q branch band pass filter.

21. The multiple stage band pass filter of claim 18, wherein:

one of the transconductance elements of the plurality of I branch band pass filters is operable to have its biasing voltage altered to adjust a gain of the corresponding I branch band pass filter; and one of the transconductance elements of the plurality of Q branch band pass filters is operable to have its biasing voltage altered to adjust a gain of the corresponding Q branch band pass filter.

22. A multiple stage band pass filter of a Radio Frequency (RF) Integrated Circuit comprising:

a low pass mixer output filter operable to receive a down sampled analog information signal;

a buffer communicatively coupled to an output of the low pass mixer output filter;

a low pass buffer output filter communicatively coupled to an output of the buffer; and a plurality of band pass filters communicatively coupled to an output of the low pass buffer output filter, wherein the low pass mixer output filter, the low pass buffer output filter, and the plurality of band pass filters are operable to be tuned to meet out of channel and out of band blocking requirements, and wherein the low pass mixer output filter, the low pass buffer output filter, and the plurality band pass filters are operable to be tuned to meet in-channel gain requirements.

23. The multiple stage band pass filter of claim 22, wherein at least one of the plurality of band pass filters comprises a plurality of transconductance elements and at least one low pass filter.

24. The multiple stage band pass filter of claim 23, wherein one of the transconductance elements of the plurality of band pass filters is operable to be enabled/disabled to adjust a gain of the corresponding band pass filter.

25. The multiple stage band pass filter of claim 23, wherein one of the transconductance elements of the plurality of band pass filters is operable to have its biasing impedance altered to adjust a gain of the corresponding band pass filter.

26. The multiple stage band pass filter of claim 23, wherein one of the transconductance elements of the plurality of band pass filters is operable to have its biasing voltage altered to adjust a gain of the corresponding band pass filter.

* * * * *